United States Patent
Ou et al.

(10) Patent No.: US 12,406,124 B2
(45) Date of Patent: Sep. 2, 2025

(54) VARIABLE TRACKS AND NON-DEFAULT RULE ROUTING

(71) Applicant: Taiwan Semiconductor Manufacturing Company, Ltd., Hsinchu (TW)

(72) Inventors: Hung-Chih Ou, Kaohsiung (TW); Wen-Hao Chen, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 685 days.

(21) Appl. No.: 17/668,117

(22) Filed: Feb. 9, 2022

(65) Prior Publication Data
US 2023/0014110 A1   Jan. 19, 2023

Related U.S. Application Data

(60) Provisional application No. 63/220,676, filed on Jul. 12, 2021.

(51) Int. Cl.
*G06F 30/392* (2020.01)
*G06F 30/394* (2020.01)

(52) U.S. Cl.
CPC .......... *G06F 30/392* (2020.01); *G06F 30/394* (2020.01)

(58) Field of Classification Search
CPC .............................. G06F 30/392; G06F 30/394
See application file for complete search history.

(56) References Cited

U.S. PATENT DOCUMENTS

| | | | |
|---|---|---|---|
| 8,443,324 B2 * | 5/2013 | Alpert | G06F 30/3312 716/135 |
| 8,607,180 B2 * | 12/2013 | Soni | G06F 30/394 716/129 |
| 8,769,468 B1 * | 7/2014 | Alpert | G06F 30/327 716/130 |
| 9,003,349 B1 * | 4/2015 | Salowe | G06F 30/394 716/122 |
| 9,117,052 B1 * | 8/2015 | Salowe | G06F 30/398 |
| 9,165,103 B1 * | 10/2015 | Salowe | G06F 30/394 |
| 9,251,299 B1 * | 2/2016 | Salowe | G06F 30/00 |
| 9,372,955 B1 * | 6/2016 | Lee | G06F 30/394 |
| 9,564,394 B1 * | 2/2017 | Roth | H01L 21/768 |
| 10,282,505 B1 * | 5/2019 | Ginetti | G06F 30/394 |
| 10,296,695 B1 * | 5/2019 | Lee | G03F 1/00 |
| 10,452,806 B1 * | 10/2019 | Rossman | G06F 30/398 |
| 10,733,351 B1 * | 8/2020 | Matsunami | G06F 30/394 |
| 10,810,348 B1 * | 10/2020 | Darden | G03F 7/70466 |
| 10,831,971 B1 * | 11/2020 | Quay | G06F 30/337 |
| 11,042,684 B1 * | 6/2021 | Srivastava | G06F 30/392 |
| 11,126,780 B1 * | 9/2021 | Chung | G06F 30/3947 |
| 2011/0061037 A1 * | 3/2011 | Croysdale | G06F 30/394 716/122 |

(Continued)

*Primary Examiner* — Nha T Nguyen
(74) *Attorney, Agent, or Firm* — Merchant & Gould P.C

(57) ABSTRACT

A device including first track groups on a first conductive layer of an integrated circuit. Each of the first track groups including at least one of a different first track group pitch, a different first track group spacing, and a different first track group width than the other first track groups. Where each of the first track groups includes first tracks that have at least one of a different first track width and a different first track spacing than the first tracks in the other first track groups.

20 Claims, 10 Drawing Sheets

(56) References Cited

U.S. PATENT DOCUMENTS

2017/0045576 A1* 2/2017 Balasubramanian ........................ G01R 31/31725
2017/0193148 A1* 7/2017 Liu ..................... H01L 23/5226
2017/0300608 A1* 10/2017 Narisetty .............. G06F 30/331

* cited by examiner

VARIABLE TRACKS AND NON-DEFAULT RULE ROUTING

CROSS-REFERENCE TO RELATED APPLICATIONS

This application claims the benefit of U.S. Provisional Patent Application No. 63/220,676, filed on Jul. 12, 2021, the disclosure of which is incorporated by reference in its entirety.

BACKGROUND

Typically, a circuit designer creates an integrated circuit (IC) design in the form of a netlist referencing circuit devices, such as cells and components, to be included in the IC and indicating which conductive net is to be connected to each device terminal. The IC designer may process the netlist using an automatic placement and routing (APR) tool that automatically generates an IC layout indicating the position and orientation of each device within the IC and how conductors forming the nets are to be routed within the IC. Also, the IC designer may use non-default rule (NDR) routing in routing the nets of the IC. NDR routing is a technique for changing the resistance and/or capacitance of interconnect conductors in an IC. An NDR routing tool selects timing critical nets from the netlist and estimates the timing or resistance/capacitance (RC) benefits that can be achieved with NDR routing. One or more NDR constraints may be assigned to nets for the router to follow during routing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
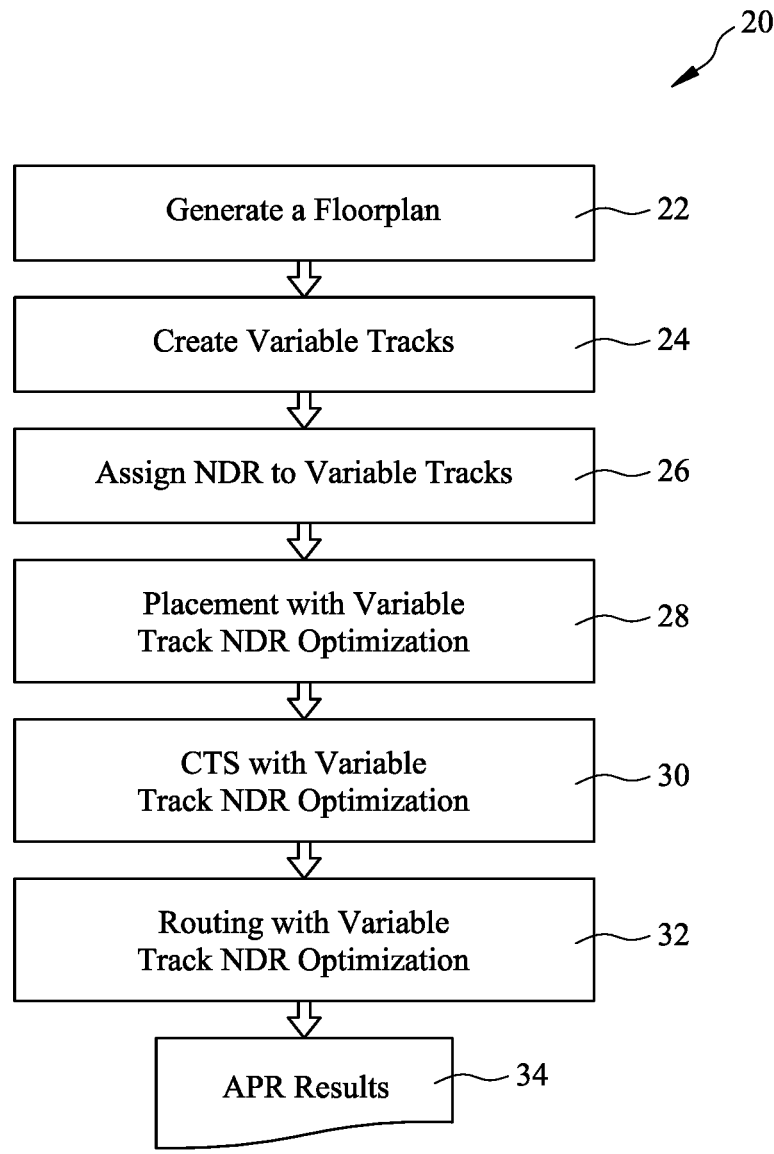
FIG. 1 is a flow-chart diagram schematically illustrating a variable track based NDR routing system and methodology, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC designer may use NDR routing in routing the nets of an IC. NDR routing is a technique for changing the resistance and/or capacitance of interconnect conductors in an IC. An NDR routing tool selects timing critical nets from the netlist and estimates the timing or resistance/capacitance (RC) benefits that can be achieved with NDR routing. One or more NDR constraints may be assigned to nets for the router to follow during routing. However, NDR routing may use additional design rule support and routing resources and make it more difficult for the APR tool to resolve design rules while maintaining the NDRs. As a result, NDR routing may increase the difficulty in estimating timing benefits by introducing a gap between pre-routing stage estimates and post-routing stage results, where the router may not follow the NDRs since they are not the highest priority for design rule checking (DRC) convergence during routing.

Disclosed embodiments provide a variable track based NDR routing system and methodology that mitigates the challenges introduced by NDR routing. Pre-defined variable tracks, also referred to herein as variable track groups, with different track pitches, widths, and/or spacing are provided for NDR routing and optimization. For example, one or more variable tracks have pitch, width, and/or spacing characteristics for routing nets having double width and double spacing (2W2S) NDRs. As a result, nets having 2W2S NDRs are successfully routed in the one or more variable tracks. This successful routing makes it easier to estimate the routing resources used during routing, eliminates additional design rule checking for the nets, and improves the performance gap between pre-routing timing estimates and post-routing timing results. In addition, the variable track based NDR routing system and methodology can be used to upgrade or further improve design performance.

In some embodiments, the variable track based NDR routing system and methodology includes: generating a floorplan of functional blocks for an IC; creating variable tracks for at least one conductive layer of the IC; assigning NDRs to the variable tracks; placement of circuit devices using variable track NDR optimization; providing clock tree synthesis (CTS) using variable track NDR optimization; routing nets of the IC using variable track NDR optimization; and providing routed results.

In some embodiments, the variable track based NDR routing system and methodology is used to further optimize the design of the IC. In some embodiments, the router assigns NDRs to nets and automatically routes the nets on variable tracks assigned NDRs that match the nets NDRs. Then, the router upgrades or downgrades the NDRs, such as the width and/or spacing, to further reduce or increase resistance, capacitance, and the timing of the nets to improve performance and/or reduce power.

The disclosed embodiments combine NDR routing with variable tracks having different pitches, widths, and/or spacing for improving the performance of the IC. The variable track based NDR routing system and methodology improves successful routing of nets assigned NDR constraints, which reduces the gap between pre-routing timing estimates and post-routing timing results. A further advantage of the variable track based NDR routing system and methodology includes simplifying design rule checking (DRC), such that all the nets with NDR constraints are free of problems from DRC. In addition, the variable track based NDR routing system and methodology improves the performance and power usage of the ICs, including high-performance computing (HPC) designs, which appeals to the marketplace.

FIG. 1 is a flow-chart diagram schematically illustrating a variable track based NDR routing system and methodology 20, in accordance with some embodiments. The variable track based NDR routing system and methodology 20, also referred to herein as the system 20, includes pre-defined variable track groups for at least one conductive layer of an IC. Each of the predefined variable track groups for a conductive layer is different from the other variable track groups for the same conductive layer, where the variable track groups have different pitches, widths, and/or spacing. NDR constraints are assigned to the variable track groups based on the variable track groups pitch, width, and spacing characteristics being able to meet or exceed the NDR constraints. As a result, during routing, nets or tracks having NDR constraints that match the NDR constraints assigned to a variable track group can be successfully routed in that variable track group. This makes it easier to estimate routing resources, eliminates checking additional design rules for the routed nets, and improves the performance gap between pre-routing timing estimates and post-routing timing results.

At 22, the system 20 includes creating or generating a floorplan of functional blocks of the IC, where the floorplan is a schematic representation of tentative placement of the major functional blocks of the IC.

At 24, the system 20 includes creating variable tracks for at least one conductive layer of the IC, which includes creating multiple variable track groups for at least one conductive layer. Each of the variable track groups is a pre-defined variable track group that includes parameters for pitch, width, and spacing. Also, each of the predefined variable track groups for one conductive layer is different from the other variable track groups for that conductive layer, where the variable track groups have different pitches, widths, and/or spacing.

At 26, the system 20 includes assigning NDRs to the variable tracks. The NDRs include constraint parameters for routing nets in the IC. The constraint parameters include the width of a net, the spacing between nets, and, in some embodiments, the pitch between nets. A variable track group is assigned NDR constraints based on whether the pitch, width, and spacing characteristics of the variable track group can meet or exceed the NDR constraints.

At 28, the system 20 includes placement of circuit devices in the IC with variable track NDR optimization and, at 30, the system 20 includes providing CTS with variable track NDR optimization. The system 20 includes a placement and CTS optimization engine that assigns NDR constraints to nets and then assigns the nets to the variable track groups of the different conductive layers based on the NDR constraints assigned to the variable track groups. In some embodiments, one or more nets with NDR constraints are trial routed in a variable track group of a conductive layer and timing estimates are determined, such as by simulations, to determine whether the routed net meets timing requirements.

At 32, the system 20 includes routing nets of the IC with variable track NDR optimization. This includes assigning NDR constraints to nets and routing the nets in a variable track group of a conductive layer based on the NDR constraints of the net matching the NDR constraints assigned to the variable track group of the conductive layer. In some embodiments, routing the nets includes automatically routing the nets using an APR tool. In some embodiments, the router can upgrade or downgrade the NDR constraints to further reduce or increase resistance and/or capacitance of a critical or non-critical net to improve performance of the IC.

At 34, the system 20 includes providing routed results, such as providing APR results. APR is the process whereby a gate-level netlist is physically implemented in a layout by placing cells in the layout and auto-routing nets between the cells based on the connections inferred from the netlist. In some embodiments, the routed results are a layout of the IC to be used in making masks and manufacturing the IC.

The system 20 combines NDR routing with variable tracks to improve successful routing of nets having NDRs. This reduces the gap between pre-routing timing estimates and post-routing timing results. Also, the system 20 simplifies DRC since the routed nets with NDR constraints are free of problems from DRC.

Figure 2:
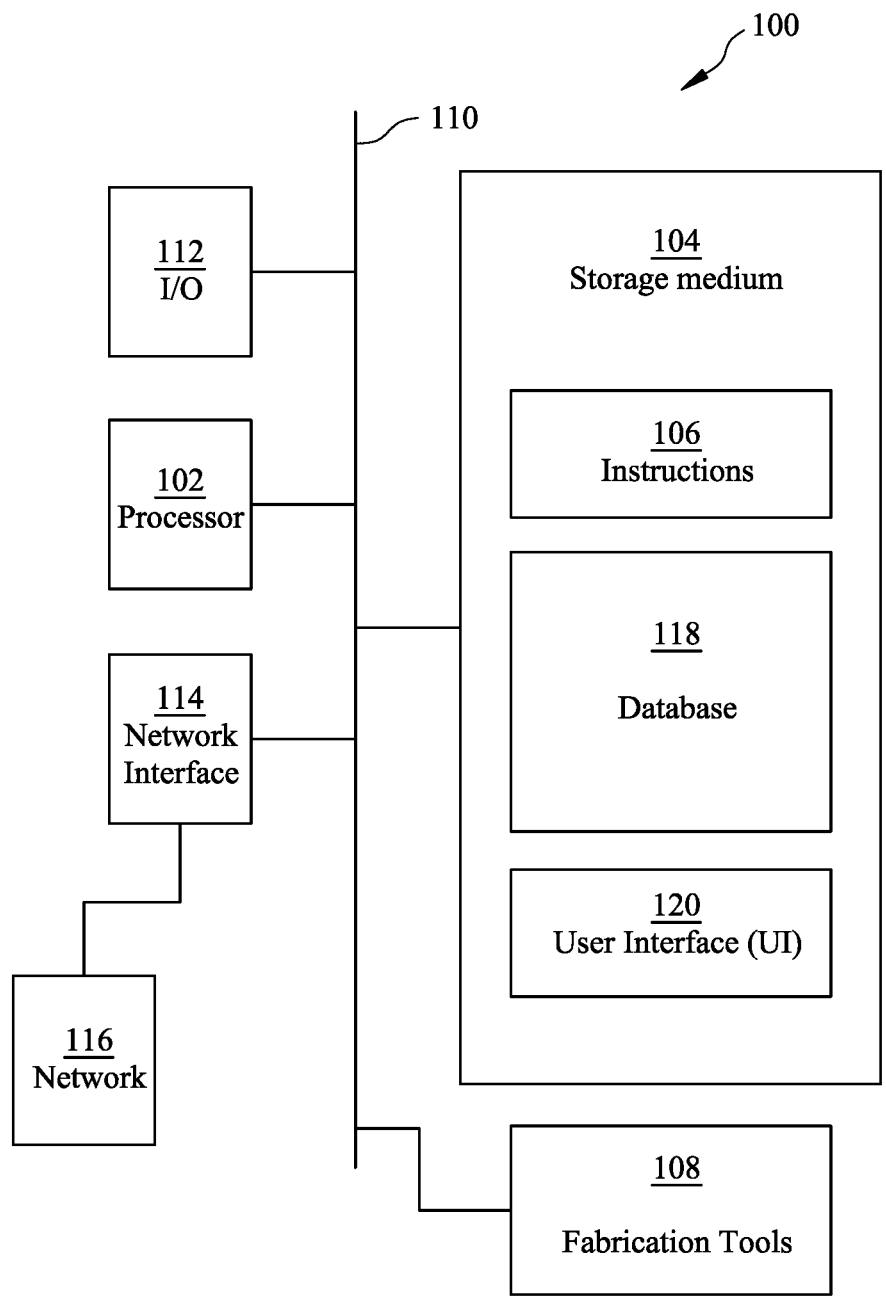
FIG. 2 is a block diagram schematically illustrating an example of a computer system configured to provide the variable track based NDR routing system and methodology of FIG. 1, in accordance with some embodiments.

FIG. 2 is a block diagram illustrating an example of a computer system 100 configured to provide the variable track based NDR routing system and methodology 20, in accordance with some embodiments. Some or all the design and manufacture of ICs, including the variable track based NDR routing, can be performed by or with the computer system 100. In some embodiments, the computer system 100 includes an EDA system.

In some embodiments, the system 100 is a general-purpose computing device including a processor 102 and a non-transitory, computer-readable storage medium 104. The computer-readable storage medium 104 may be encoded with, e.g., store, computer program code such as executable instructions 106. Execution of the instructions 106 by the processor 102 provides (at least in part) a design tool that implements a portion or all the functions of the system 100, such as the system 20, pre-layout simulations, post-layout simulations, rerouting of the IC, and a final layout for manufacturing. Further, fabrication tools 108 are included to further layout and physically implement the design and manufacture of the ICs. In some embodiments, the system 100 includes a commercial router. In some embodiments, the system 100 includes an APR system.

The processor 102 is electrically coupled to the computer-readable storage medium 104 by a bus 110 and to an I/O interface 112 by the bus 110. A network interface 114 is also electrically connected to the processor 102 by the bus 110. The network interface 114 is connected to a network 116, so that the processor 102 and the computer-readable storage medium 104 can connect to external elements using the network 116. The processor 102 is configured to execute the computer program code or instructions 106 encoded in the computer-readable storage medium 104 to cause the system 100 to perform a portion or all of the functions of the system 100, such as providing the system 20 described herein and other functions of the system 100. In some embodiments, the processor 102 is a central processing unit (CPU), a multi-processor, a distributed processing system, an application specific integrated circuit (ASIC), and/or a suitable processing unit.

In some embodiments, the computer-readable storage medium 104 is an electronic, magnetic, optical, electromagnetic, infrared, and/or semiconductor system or apparatus or device. For example, the computer-readable storage medium 104 can include a semiconductor or solid-state memory, a magnetic tape, a removable computer diskette, a random access memory (RAM), a read-only memory (ROM), a rigid magnetic disk, and/or an optical disk. In some embodiments using optical disks, the computer-readable storage medium 104 can include a compact disk, read only memory (CD-ROM), a compact disk read/write memory (CD-R/W), and/or a digital video disc (DVD).

In some embodiments, the computer-readable storage medium 104 stores computer program code or instructions 106 configured to cause the system 100 to perform a portion or all the functions of the system 100. In some embodiments, the computer-readable storage medium 104 also stores information which facilitates performing a portion or all the functions of the system 100. In some embodiments, the computer-readable storage medium 104 stores a database 118 that includes one or more of component libraries, digital circuit cell libraries, and databases.

The EDA system 100 includes the I/O interface 112, which is coupled to external circuitry. In some embodiments, the I/O interface 112 includes a keyboard, keypad, mouse, trackball, trackpad, touchscreen, and/or cursor direction keys for communicating information and commands to the processor 102.

The network interface 114 is coupled to the processor 102 and allows the system 100 to communicate with the network 116, to which one or more other computer systems are connected. The network interface 114 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 100 can be performed in two or more systems that are like system 100.

The system 100 is configured to receive information through the I/O interface 112. The information received through the I/O interface 112 includes one or more of instructions, data, design rules, libraries of components and cells, and/or other parameters for processing by processor 102. The information is transferred to the processor 102 by the bus 110. Also, the system 100 is configured to receive information related to a user interface (UI) through the I/O interface 112. This UI information can be stored in the computer-readable storage medium 104 as a UI 120.

In some embodiments, a portion or all the functions of the system 100 are implemented via a standalone software application for execution by a processor. In some embodiments, a portion or all the functions of the system 100 are implemented in a software application that is a part of an additional software application. In some embodiments, a portion or all the functions of the system 100 are implemented as a plug-in to a software application. In some embodiments, at least one of the functions of the system 100 is implemented as a software application that is a portion of an EDA tool. In some embodiments, a portion or all the functions of the system 100 are implemented as a software application that is used by the system 100. In some embodiments, a layout diagram is generated using a tool such as VIRTUOSO available from CADENCE DESIGN SYSTEMS, Inc., or another suitable layout generating tool.

In some embodiments, the variable track based NDR routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a DVD, a magnetic disk such as a hard disk, a semiconductor memory such as a ROM and RAM, and a memory card, and the like.

As noted above, embodiments of the system 100 include fabrication tools 108 for implementing the manufacturing processes of the system 100. For example, based on the final layout, photolithographic masks may be generated, which are used to fabricate the IC by the fabrication tools 108.

Figure 3:
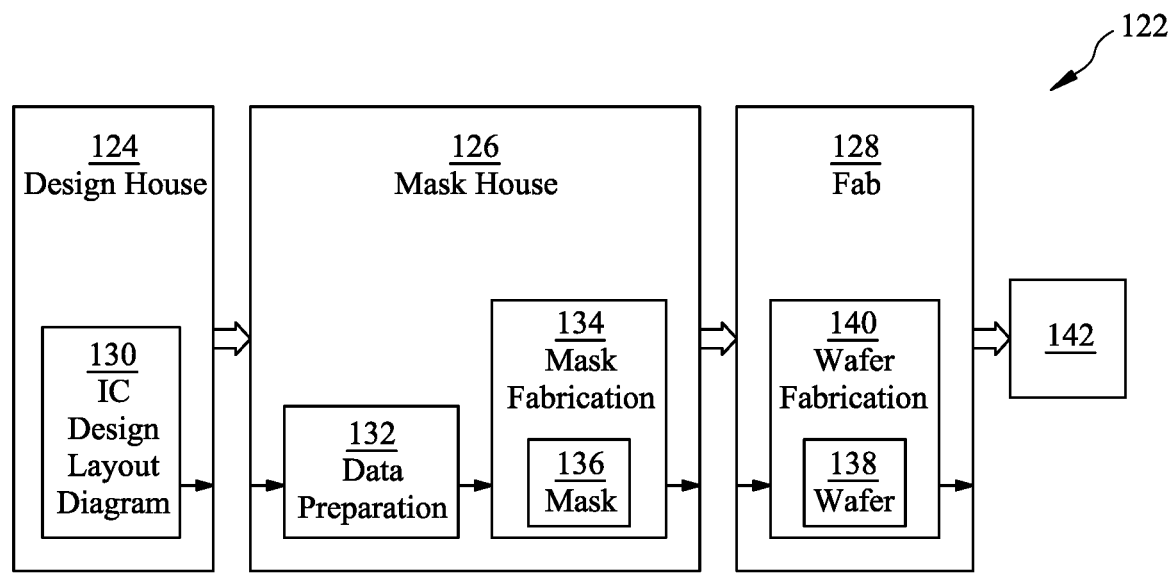
FIG. 3 is a block diagram of an IC manufacturing system and an IC manufacturing flow associated with the computer system of FIG. 2, in accordance with some embodiments.

Further aspects of device fabrication are disclosed in conjunction with FIG. 3, which is a block diagram of an IC manufacturing system 122 and an IC manufacturing flow associated therewith, in accordance with some embodiments. In some embodiments, based on a layout diagram, one or more semiconductor masks and/or at least one component in a layer of a semiconductor IC is fabricated using the manufacturing system 122.

In FIG. 3, the IC manufacturing system 122 includes entities, such as a design house 124, a mask house 126, and an IC manufacturer/fabricator ("fab") 128, that interact with one another in the design, development, and manufacturing cycles and/or services related to manufacturing an IC, such as the ICs described herein. The entities in the system 122 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 124, the mask house 126, and the IC fab 128 are owned by a single larger company. In some embodiments, two or more of the design house 124, the mask house 126, and the IC fab 128 coexist in a common facility and use common resources.

The design house (or design team) 124 generates an IC design layout diagram 130. The IC design layout diagram 130 includes various geometrical patterns, or IC layout diagrams designed for an IC device. The geometrical patterns correspond to patterns of metal, oxide, or semiconductor layers that make up the various components of the semiconductor structures to be fabricated. The various layers combine to form various IC features. For example, a portion of the IC design layout diagram 130 includes various IC features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 124 implements a design procedure to form an IC design layout diagram 130. The IC design layout diagram 130 is presented in one or more data files having information of the geometrical patterns. For example, IC design layout diagram 130 can be expressed in a GDSII file format or DFII file format. In some embodiments, the design procedure includes one or more of analog circuit design, digital logic circuit design, the variable track based NDR routing system and methodology 20, described herein, place and route routines, and physical layout designs.

The mask house 126 includes data preparation 132 and mask fabrication 134. The mask house 126 uses the IC design layout diagram 130 to manufacture one or more masks 136 to be used for fabricating the various layers of the IC or semiconductor structure. The mask house 126 performs mask data preparation 132, where the IC design layout diagram 130 is translated into a representative data file (RDF). The mask data preparation 132 provides the RDF to the mask fabrication 134. The mask fabrication 134 includes a mask writer that converts the RDF to an image on a substrate, such as a mask (reticle) 136 or a semiconductor wafer 138. The design layout diagram 130 is manipulated by the mask data preparation 132 to comply with characteristics of the mask writer and/or criteria of the IC fab 128. In FIG. 3, the mask data preparation 132 and the mask fabrication 134 are illustrated as separate elements. In some embodiments, the mask data preparation 132 and the mask fabrication 134 can be collectively referred to as mask data preparation.

In some embodiments, the mask data preparation 132 includes an optical proximity correction (OPC) which uses lithography enhancement techniques to compensate for image errors, such as those that can arise from diffraction, interference, other process effects and the like. The OPC adjusts the IC design layout diagram 130. In some embodiments, the mask data preparation 132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 132 includes a mask rule checker (MRC) that checks the IC design layout diagram 130 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 130 to compensate for limitations during the mask fabrication 134, which may undo part of the modifications performed by OPC to meet mask creation rules.

In some embodiments, the mask data preparation 132 includes lithography process checking (LPC) that simulates processing that will be implemented by the IC fab 128. LPC simulates this processing based on the IC design layout diagram 130 to create a simulated manufactured device. The processing parameters in LPC simulation can include parameters associated with various processes of the IC manufacturing cycle, parameters associated with tools used for manufacturing the IC, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 130.

The above description of mask data preparation 132 has been simplified for the purposes of clarity. In some embodiments, data preparation 132 includes additional features such as a logic operation (LOP) to modify the IC design layout diagram 130 according to manufacturing rules. Additionally, the processes applied to the IC design layout diagram 130 during data preparation 132 may be executed in a variety of different orders.

After the mask data preparation 132 and during the mask fabrication 134, a mask 136 or a group of masks 136 are fabricated based on the modified IC design layout diagram 130. In some embodiments, the mask fabrication 134 includes performing one or more lithographic exposures based on the IC design layout diagram 130. In some embodiments, an electron-beam (e-beam) or a mechanism of multiple e-beams is used to form a pattern on a mask (photomask or reticle) 136 based on the modified IC design layout diagram 130. The mask 136 can be formed in various technologies. In some embodiments, the mask 136 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 136 includes a transparent substrate (e.g., fused quartz) and an opaque material (e.g., chromium) coated in the opaque regions of the binary mask. In another example, the mask 136 is formed using a phase shift technology. In a phase shift mask (PSM) version of the mask 136, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 134 is used in a variety of processes. For example, such a mask(s) is used in an ion implantation process to form various doped regions in the semiconductor wafer 138, in an etching process to form various etching regions in the semiconductor wafer 138, and/or in other suitable processes.

The IC fab 128 includes wafer fabrication 140. The IC fab 128 is an IC fabrication business that includes one or more manufacturing facilities for the fabrication of a variety of different IC products. In some embodiments, the IC fab 128 is a semiconductor foundry. For example, there may be a manufacturing facility for the front end of line (FEOL) fabrication of a plurality of IC products, while a second manufacturing facility may provide the back end of line (BEOL) fabrication for the interconnection and packaging of the IC products, and a third manufacturing facility may provide other services for the foundry business.

The IC fab 128 uses the mask(s) 136 fabricated by the mask house 126 to fabricate the semiconductor structures or ICs 142 of the current disclosure. Thus, the IC fab 128 at least indirectly uses the IC design layout diagram 130 to fabricate the semiconductor structures or ICs 142 of the current disclosure. Also, the semiconductor wafer 138 includes a silicon substrate or other proper substrate having material layers formed thereon, and the semiconductor wafer 138 further includes one or more of various doped regions, dielectric features, multilevel interconnects, and the like (formed at subsequent manufacturing steps). In some embodiments, the semiconductor wafer 138 is fabricated by the IC fab 128 using the mask(s) 136 to form the semiconductor structures or ICs 142 of the current disclosure. In some embodiments, the IC fabrication includes performing one or more lithographic exposures based at least indirectly on the IC design layout diagram 130.

As described above, the system 20 of FIG. 1 includes: at 22, generating a floorplan of functional blocks for an IC; at 24, creating variable tracks for at least one conductive layer of the IC; at 26, assigning NDRs to the variable tracks; at 28, placement of circuit devices in the IC using variable track NDR optimization; at 30, providing CTS using variable track NDR optimization; at 32, routing nets of the IC using variable track NDR optimization; and at 34, providing routed results. The system 20 is further described below with reference to the figures.

Figure 4:
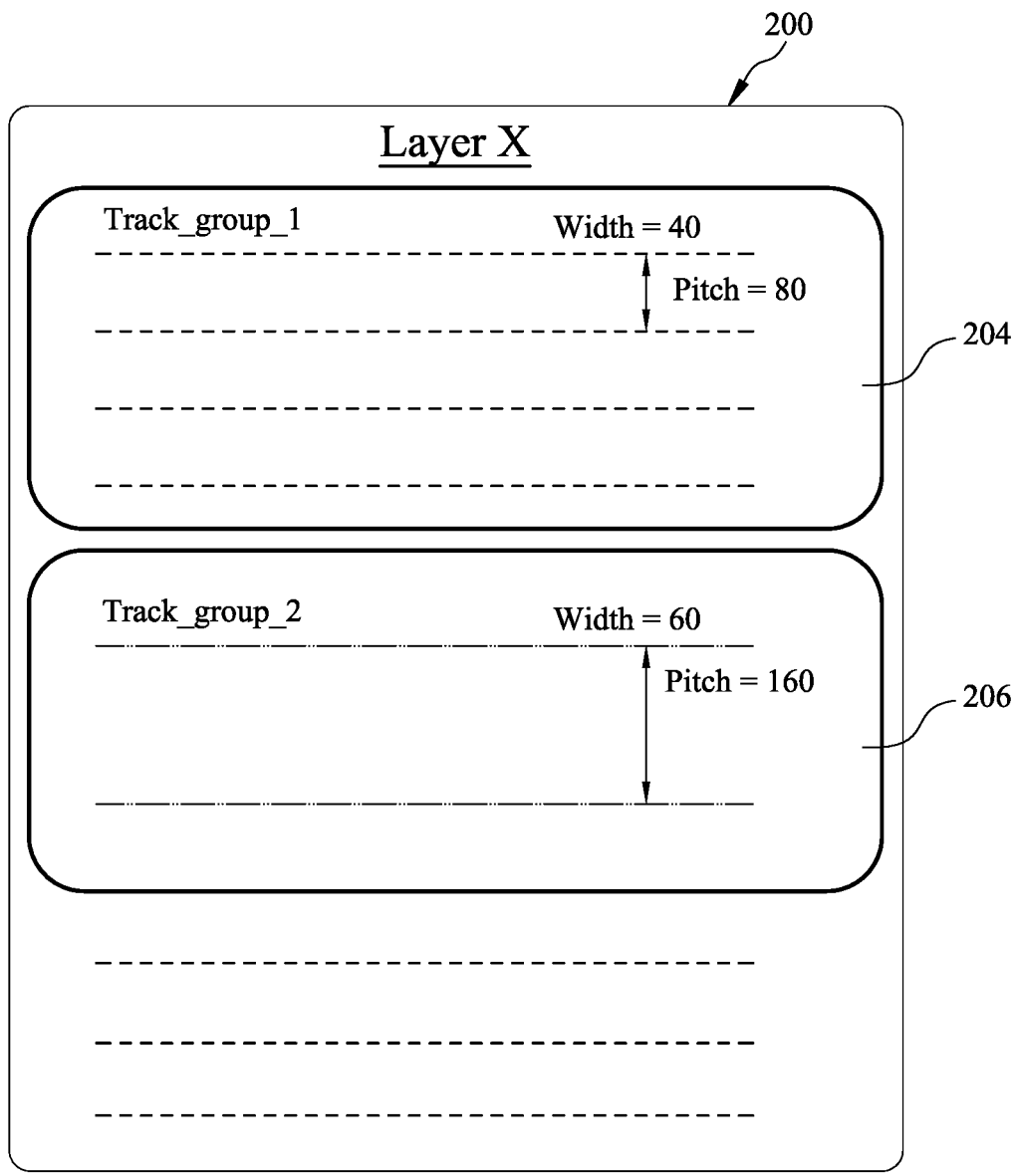
FIG. 4 is a diagram schematically illustrating variable track groups created for the conductive layer X of the IC, in accordance with some embodiments.
Figure 5:
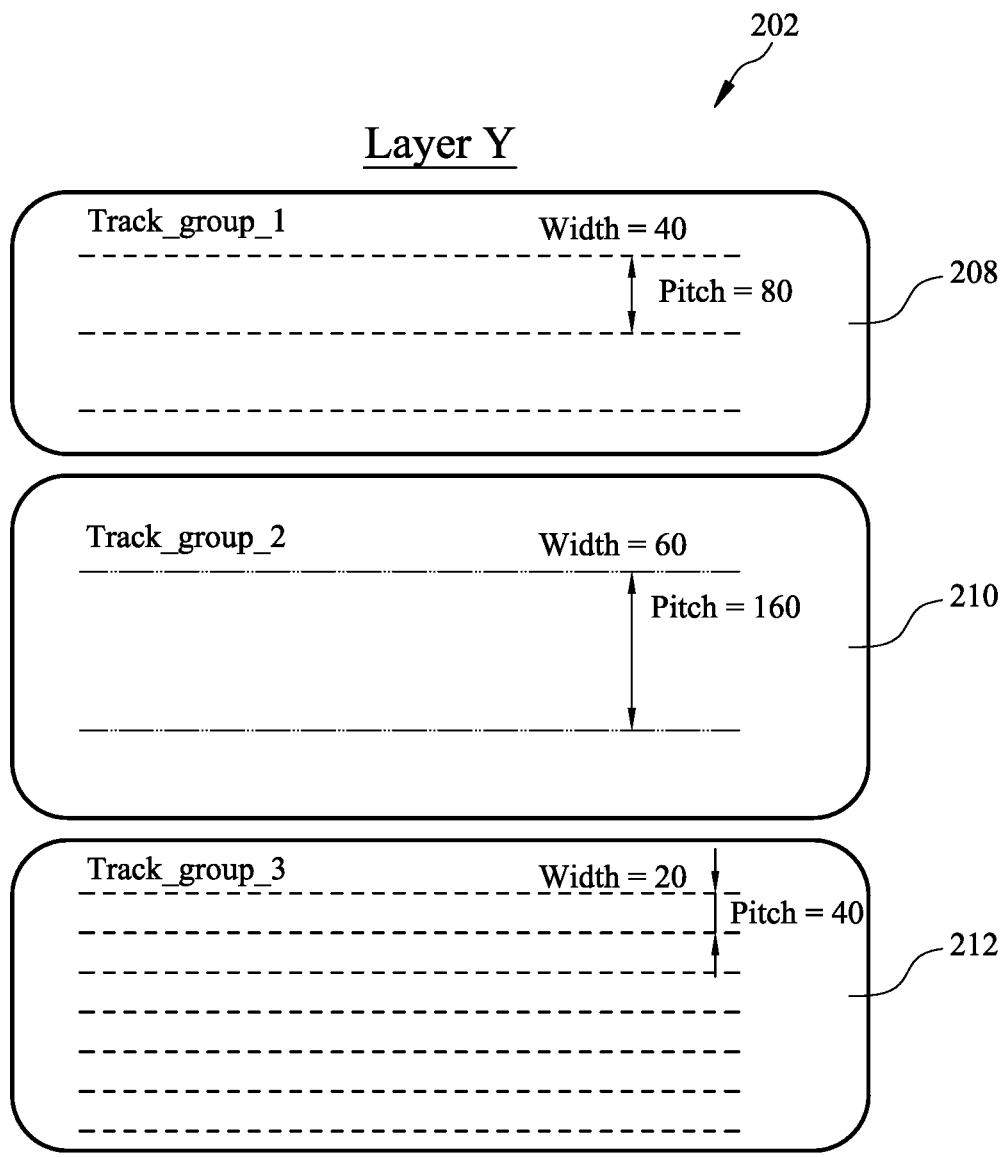
FIG. 5 is a diagram schematically illustrating variable track groups created for the conductive layer Y of the IC, in accordance with some embodiments.

FIGS. 4 and 5 are diagrams schematically illustrating example variable track groups 200 created for a conductive layer X of an IC and example variable track groups 202 created for a conductive layer Y of the IC, in accordance with some embodiments. The system 20, creates the variable track groups 200 and 202 at 24 where the system 20 creates variable tracks for at least one of the conductive layers. The conductive layers X and Y are used for routing nets or tracks in the IC.

FIG. 4 is a diagram schematically illustrating the variable track groups 200 created for the conductive layer X of the IC, in accordance with some embodiments. The variable track groups 200 include a first variable track group 204 and a second variable track group 206. The first variable track group 204 includes a pitch, which is the distance between mid-lines of adjacent conductive tracks, of 80 nanometers (nm) and a conductive track width of 40 nm. The second variable track group 206 includes a pitch of 160 nm and a conductive track width of 60 nm. The variable track groups 200 are used for placement of circuit devices, CTS, and routing of nets in the conductive layer X.

FIG. 5 is a diagram schematically illustrating the variable track groups 202 created for the conductive layer Y of the IC, in accordance with some embodiments. The variable track groups 202 include a first variable track group 208, a second variable track group 210, and a third variable track group 212. The first variable track group 208 includes a pitch of 80 nm and a conductive track width of 40 nm. The second variable track group 210 includes a pitch of 160 nm and a conductive track width of 60 nm. The third variable track group 212 includes a pitch of 40 nm and a conductive track width of 20 nm. These variable track groups 202 are used for placement of circuit devices, CTS, and routing of nets in the conductive layer Y.

At 26, the system 20 assigns NDRs to the variable tracks, such as to the variable track groups 200 and 202. The NDRs include constraints for routing nets in the IC. The rules can include the width of a net, the spacing between nets, and the pitch between nets. NDR constraints are assigned to a variable track group based on whether the variable track group can provide or meet the NDR constraints.

Figure 6:
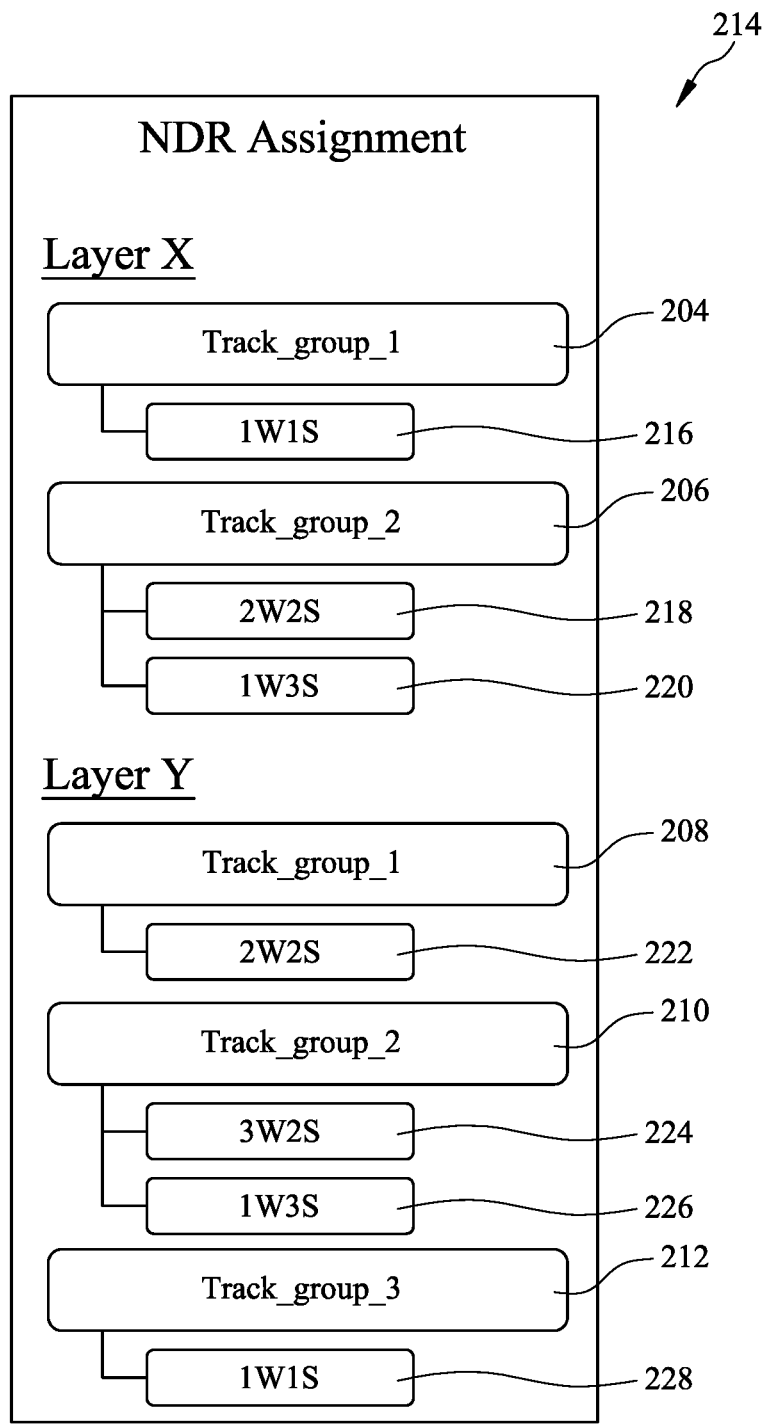
FIG. 6 is a diagram schematically illustrating example NDR assignments for the variable track groups for conductive layer X and for the variable track groups for conductive layer Y, in accordance with some embodiments.

FIG. 6 is a diagram schematically illustrating an example NDR assignment 214 for the variable track groups 200 for conductive layer X and for the variable track groups 202 for conductive layer Y, in accordance with some embodiments.

At 216, NDRs of a single width and a single spacing (1W1S) are assigned to the first variable track group 204 for conductive layer X. At 218, NDRs of a double width and a double spacing (2W2S) and, at 220, NDRs of a single width and a triple spacing (1W3S) are assigned to the second variable track group 206 for conductive layer X. Nets having NDR constraints of 1W1S can be routed in the first variable track group 204 and nets having NDR constraints of 2W2S and 1W3S can be routed in the second variable track group 206, with the NDR constraints of the nets being met by the matching variable track group.

At 222, NDRs of 2W2S are assigned to the first variable track group 208 for conductive layer Y. At 224, NDRs of a triple width and a double spacing (3W2S) and, at 226, 1W3S are assigned to the second variable track group 210 for conductive layer Y. At 228, NDRs of 1W1S are assigned to the third variable track group 212 for conductive layer Y. Nets having NDR constraints of 2W2S can be routed in the first variable track group 208, nets having NDR constraints of 3W2S and 1W3S can be routed in the second variable track group 210, and nets having constraints of 1W1S can be routed in the third variable track group 212, with the NDR constraints of the nets being met by the matching variable track group.

Next, at 28, the system 20 includes placement of circuit devices in the IC with variable track NDR optimization and, at 30, the system 20 includes providing CTS with variable track NDR optimization. To provide variable track NDR optimization, the system 20 includes an engine, such as a placement and CTS optimization engine, that assigns NDR constraints to nets, including critical nets, for changing the resistance and/or capacitance of the nets and improving the timing of the nets. The nets are then assigned to one of the variable track groups 200 and 202 of the different conductive layers X and Y based on the NDR constraints of the net and the NDR constraints assigned to the variable track groups 200 and 202. In some embodiments, one or more of the nets with NDR constraints are trial routed in the variable track groups 200 and 202 of the conductive layers X and Y and timing estimates are determined, such as by simulations, to determine whether the routed net meets timing requirements.

Figure 7:
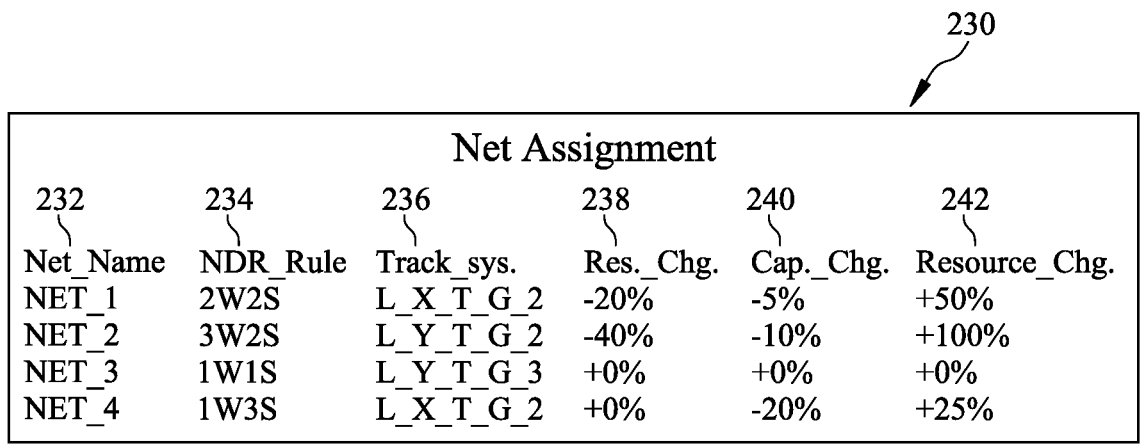
FIG. 7 is a diagram schematically illustrating a net assignment chart, in accordance with some embodiments.

FIG. 7 is a diagram schematically illustrating a net assignment chart 230, in accordance with some embodiments. The net assignment chart 230 includes columns for the net names 232, NDR rules or constraints 234 assigned to a net, the conductive layer and variable track group assignment 236 for the net, the calculated resistance change in the net 238, the calculated capacitance change in the net 240, and the calculated routing resource and timing benefit or change 242 for the net.

Each row of the net assignment chart 230 is for one of four example nets NET_1, NET_2, NET_3, and NET_4. NET_1 has NDR constraints of 2W2S and has been assigned to conductive layer X and the second variable track group 206, which results in a calculated resistance change of −20%, a calculated capacitance change of −5%, and a calculated resource improvement of 50%. NET_2 has NDR constraints of 3W2S and has been assigned to conductive layer Y and the second variable track group 210, which results in a calculated resistance change of −40%, a calculated capacitance change of −10%, and a calculated resource improvement of 100%. NET_3 has NDR constraints of 1W1S and has been assigned to conductive layer Y and the third variable track group 212, which results in a calculated resistance change of 0%, a calculated capacitance change of 0%, and a calculated resource improvement of 0%. NET_4 has NDR constraints of 1W3S and has been assigned to conductive layer X and the second variable track group 206, which results in a calculated resistance change of 0%, a calculated capacitance change of −20%, and a calculated resource improvement of 25%.

Figure 8:
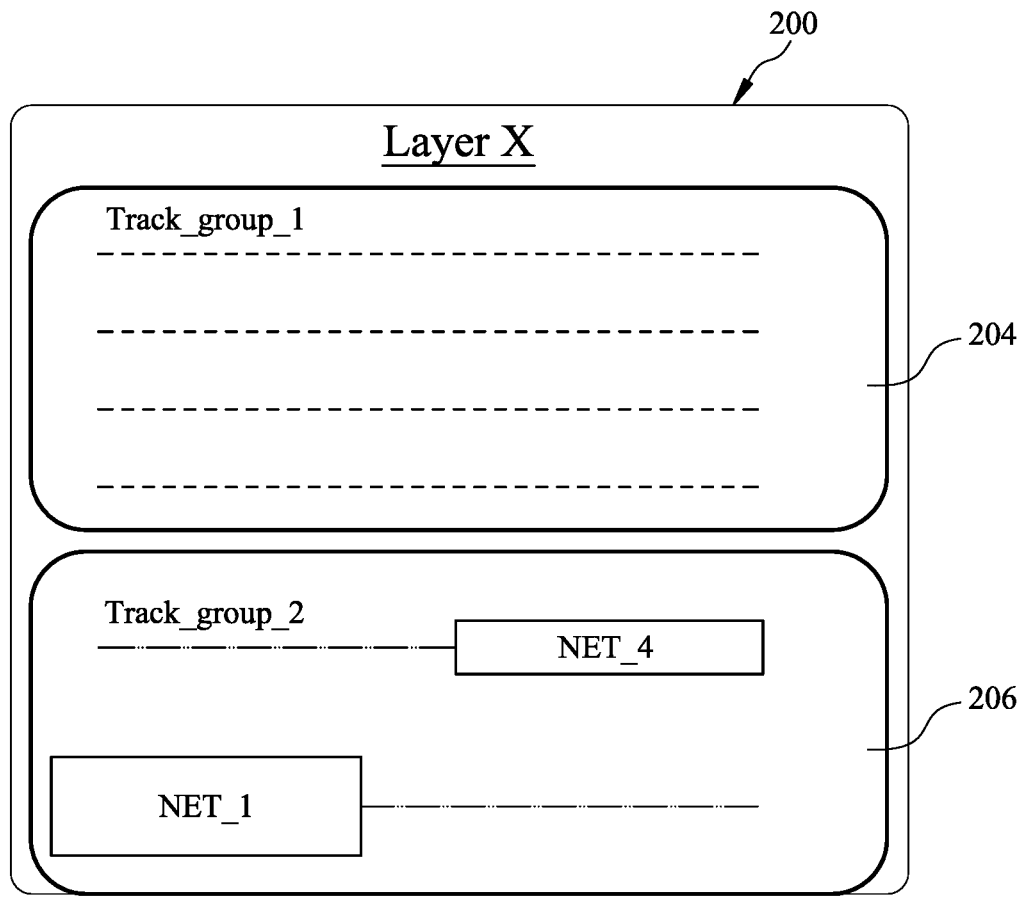
FIG. 8 is a diagram schematically illustrating example nets NET_1 and NET_4 assigned to the conductive layer X, in accordance with some embodiments.

FIG. 8 is a diagram schematically illustrating NET_1 and NET_4 (shown in FIG. 7) assigned to the conductive layer X and the second variable track group 206, in accordance with some embodiments. The net NET_1 was assigned NDR constraints of 2W2S that match the NDR constraints of 2W2S assigned to the second variable track group 206 for conductive layer X, and the net NET_4 was assigned NDR constraints of 1W3S that match the NDR constraints of 1W3S assigned to the second variable track group 206 for conductive layer X, see FIG. 6.

In addition, the net NET_2 was assigned NDR constraints of 3W2S that match the NDR constraints of 3W2S assigned to the second variable track group 210 for conductive layer Y, and the net NET_3 was assigned NDR constraints of 1W1S that match the NDR constraints of 1W1S assigned to the third variable track group 212 for conductive layer Y, see FIG. 6.

At 32, the system 20 further includes routing the nets of the IC with variable track NDR optimization, which includes routing the nets with NDR constraints in variable track groups for conductive layers based on the NDR constraints of the net matching the NDR constraints assigned to the variable track group of the conductive layer. At 34, the system 20 includes providing routed results.

Figure 9:
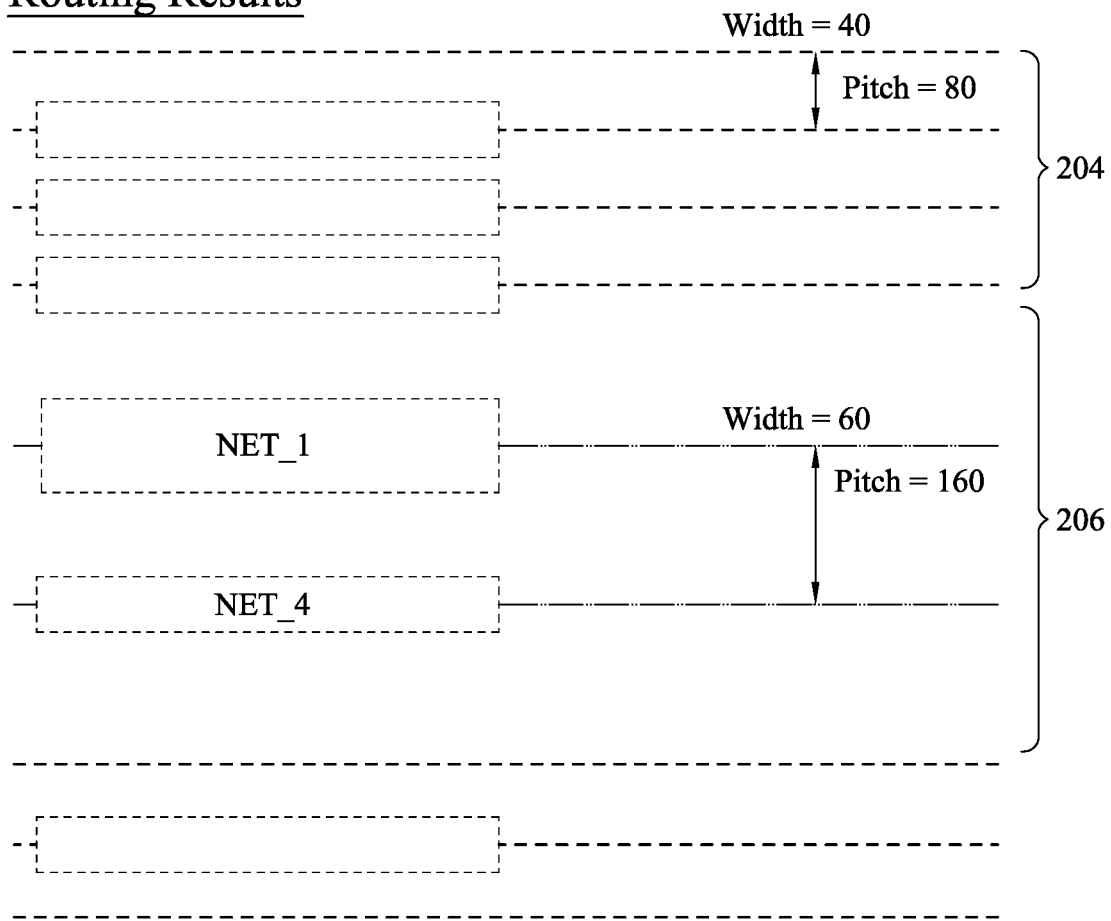
FIG. 9 is a diagram schematically illustrating the nets NET_1 and NET_4 routed in the conductive layer X of the IC, in accordance with some embodiments.

FIG. 9 is a diagram schematically illustrating NET_1 and NET_4 routed in the conductive layer X of the IC, in accordance with some embodiments. The routed nets NET_1 and NET_4 (shown in FIG. 9) are the same nets NET_1 and NET_4 referred to in relation to FIGS. 7 and 8. The net NET_1 was assigned NDR constraints of 2W2S that match the NDR constraints of 2W2S assigned to the second variable track group 206 for conductive layer X, and the net NET_4 was assigned NDR constraints of 1W3S that match the NDR constraints of 1W3S assigned to the second variable track group 206 for conductive layer X.

As illustrated, the router successfully routed the nets NET_1 and NET_4 in the second variable track group 206 of the conductive layer X, which includes a pitch of 160 nm and a width of 60 nm. Thus, each of the NDR constraints of the nets NET_1 and NET_4 is satisfied. In some embodiments, the router automatically routs the nets NET_1 and NET_4 using an APR tool.

The system 20 improves successful implementation of NDR routing rules. This makes it easier to estimate the routing resource requirements and it reduces the gap between pre-routing timing estimates and post-routing timing results. A further advantage of the system 20 includes simplifying DRC, where the routed nets are free from DRC problems and no additional DRC is necessary. In addition, the system 20 improves the performance and power usage of the ICs, including high-performance computing (HPC) designs.

Figure 10:
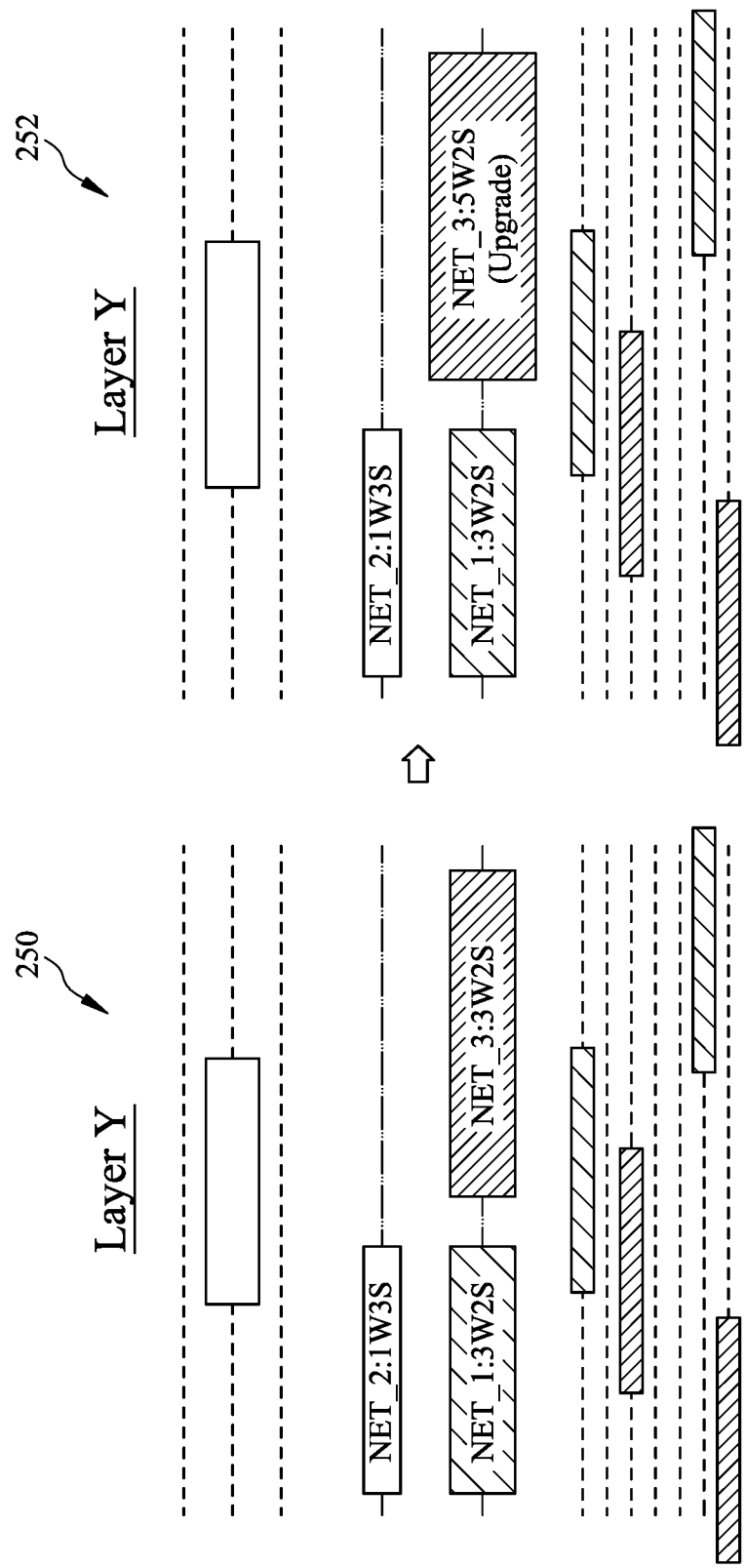
FIG. 10 is a diagram schematically illustrating an initial routing result and an upgraded routing result provided by the system, in accordance with some embodiments.

FIG. 10 is a diagram schematically illustrating a different example including an initial routing result 250 and an upgraded routing result 252 provided by the system 20, in accordance with some embodiments. The system 20 includes a router configured to upgrade or downgrade the NDR constraints of a net to further reduce or increase resistance and/or capacitance of the net to improve performance of the IC.

In this example, the initial routing result 250 includes conductive layer Y routed with nets including NET_1 having NDR constraints of a triple width and a double spacing (3W2S), NET_2 having NDR constraints of 1W3S, and NET_3 having NDR constraints of 3W2S.

The router upgrades the initial routing result 250 to provide the upgraded routing result 252. The router changes NET_3 from NDR constraints of 3W2S to NDR constraints of a quintuple width and a double spacing (5W2S) to improve the performance of the IC.

Figure 11:
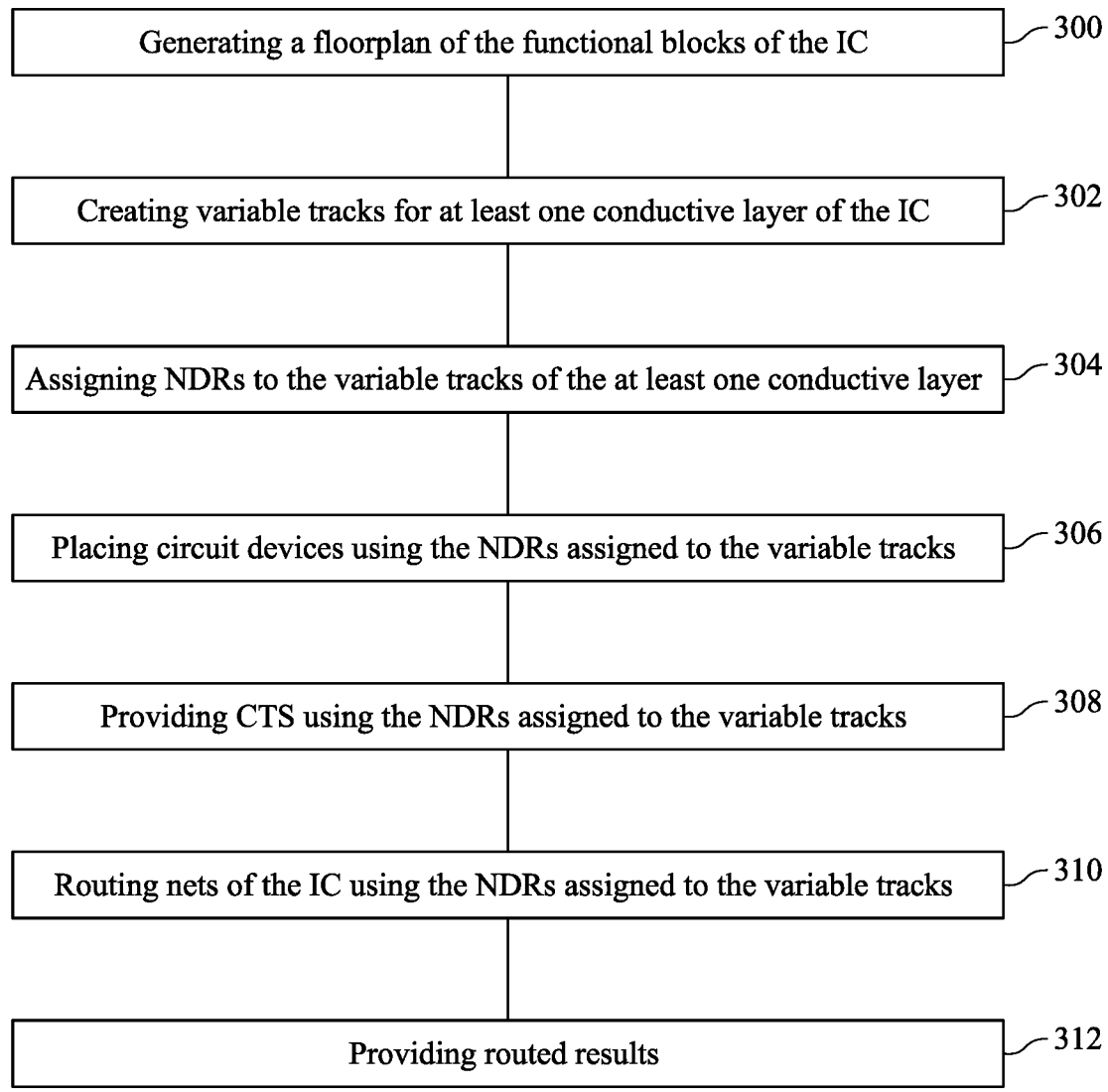
FIG. 11 is a diagram schematically illustrating a method of routing nets, assigned NDR constraints, in variable tracks of conductive layers in an IC, in accordance with some embodiments.

FIG. 11 is a diagram schematically illustrating a method of routing nets that have NDR constraints into variable tracks of conductive layers of an IC, in accordance with some embodiments. Of course, in other embodiments, the method can include more or fewer steps than those illustrated in FIG. 11.

The method includes, at 300, generating a floorplan of the functional blocks of the IC, where the floorplan is a schematic representation of tentative placement of the major functional blocks of the IC.

At 302, the method includes creating variable tracks for at least one conductive layer of the IC, which includes creating variable track groups for the at least one conductive layer. Each of the variable track groups is a pre-defined variable track group that includes characteristic parameters such as pitch, width, and spacing. Each of the predefined variable track groups for one conductive layer is different from the other variable track groups for that conductive layer. In some embodiments, creating variable tracks for at least one conductive layer includes creating variable track groups that include at least one of different track pitch, different track spacing, and different track widths.

At 304, the method includes assigning NDRs to the variable tracks of the at least one conductive layer. The NDRs include constraints for routing nets in the IC, such as the width of a net, the spacing between nets, and the pitch between nets. NDR constraints are assigned to the variable tracks or variable track groups based on whether the variable track group can meet or exceed the NDR constraints. In some embodiments, assigning NDRs to the variable tracks includes assigning NDRs that indicate track spacing and track width to more than one conductive layer of the IC.

At 306, the method includes placing circuit devices in the IC using the NDRs assigned to the variable tracks and, at 308, the method includes providing CTS using the NDRs assigned to the variable tracks. Placing the circuit devices using the NDRs assigned to the variable tracks includes placement of circuit devices in the IC with variable track NDR optimization and providing CTS using the NDRs assigned to the variable tracks includes providing CTS with variable track NDR optimization. The system 20 includes a placement and CTS optimization engine that assigns NDR constraints to nets and then assigns the nets to the variable tracks or variable track groups that have been assigned matching NDR constraints. In some embodiments, one or more nets with NDR constraints are trial routed in a variable track group of a conductive layer and timing estimates are determined, such as by simulations, to determine whether the routed net meets timing requirements.

At 310, the method includes routing nets of the IC using the NDRs assigned to the variable tracks. This includes routing nets of the IC with variable track NDR optimization, which includes assigning NDRs to nets and routing the nets having NDR constraints in a variable track group of a conductive layer based on the NDR constraints of the net matching the NDR constraints assigned to the variable track group. In some embodiments, routing the nets includes automatically routing the nets having NDR constraints using an APR tool. In some embodiments, routing the nets includes trial routing at least one of the nets using the NDRs assigned to the variable tracks or variable track groups of a conductive layer to estimate timing.

At 312, the system 20 includes providing routed results, such as providing APR results. As described above, APR is the process whereby a gate-level netlist is physically implemented in a layout by placing cells in the layout and auto-routing nets between the cells based on the connections inferred from the netlist. In some embodiments, the routed results are a layout of the IC to be used in making masks and manufacturing the IC.

In some embodiments, the router can upgrade or downgrade the NDR constraint to further reduce or increase resistance and/or capacitance of a critical or non-critical net to improve performance of the IC. In some embodiments, the router is configured to optimize performance of at least one of the nets by changing at least one of track width and track spacing from the NDRs assigned to the net.

Disclosed embodiments thus provide a system 20 that includes creating variable tracks for at least one conductive layer of the IC; assigning NDRs to the variable tracks; placement of circuit devices, providing CTS, and routing of nets using the NDRs assigned to the variable tracks and/or based on variable track NDR optimization; and providing routed results.

In some embodiments, the system 20 is used to further optimize the design of the IC. In some embodiments, the router is configured to upgrade or downgrade the width and/or spacing of a net to further reduce or increase resistance and/or capacitance of the net and improve the performance of the IC and/or reduce power usage by the IC.

The system 20 combines NDR routing of nets with variable tracks having different pitches, widths, and/or spacing. As a result, the nets having NDR constraints are successfully routed with the NDR constraints. This makes it easier to estimate the routing resources used during routing and it reduces the gap between pre-routing timing estimates and post-routing timing results. Also, the system 20 simplifies DRC since the nets are free of problems from DRC and no additional design rules need to be checked for the nets.

In accordance with some embodiments, a device includes first track groups on a first conductive layer of an integrated circuit. Each of the first track groups includes at least one of a different first track group pitch, a different first track group spacing, and a different first track group width than the other first track groups. Each of the first track groups includes first tracks that have at least one of a different first track width and a different first track spacing than the first tracks in the other first track groups.

In accordance with further embodiments, an integrated circuit includes a first layer first track group on a first conductive layer and a first layer second track group on the first conductive layer. The first layer first track group having a first plurality of conductive tracks with a first track width and defining a first pitch. The first layer second track group having a second plurality of conductive tracks with a second track width and defining a second pitch.

In accordance with still further disclosed aspects, an IC conductive track routing method includes: creating variable tracks for at least one conductive layer of an integrated circuit; assigning non-default rules to the variable tracks; routing nets of the integrated circuit using the non-default rules assigned to the variable tracks; and providing routed results.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   first track groups on a first conductive layer of an integrated circuit, each of the first track groups including at least one of a different first track group pitch, a different first track group spacing, and a different first track group width than the other first track groups,
   wherein each of the first track groups includes first tracks that have a different first track width than the first tracks in the other first track groups on the first conductive layer and that define a different first track pitch than the first tracks in the other first track groups on the first conductive layer; and
   second track groups on a second conductive layer of an integrated circuit, each of the second track groups including at least one of a different second track group pitch, a different second track group spacing, and a different second track group width than the other second track groups,
   wherein each of the second track groups includes second tracks that have at least one of a different second track width and a different second track spacing than the second tracks in the other second track groups.

2. The device of claim 1, wherein each of the first track groups includes first tracks that have a different first track width and a different first track spacing than the first tracks in the other first track groups.

3. The device of claim 1, wherein each of the second track groups includes second tracks that have a different second track width and a different second track spacing than the second tracks in the other second track groups.

4. The device of claim 1, wherein each of the second track groups includes second tracks that define a different second track pitch than the second tracks in the other second track groups.

5. The device of claim 1, wherein at least one of the first tracks is the same as one of the second tracks.

6. The device of claim 1, wherein each of the first track groups is configured to include nets having an assigned first track width and first track spacing.

7. The device of claim 1, wherein each of the second track groups is configured to include nets having an assigned second track width and second track spacing.

8. The device of claim 1, wherein each of the second track groups includes second tracks that have a different second track width and a different second track pitch than the second tracks in the other second track groups.

9. An integrated circuit, comprising:
a first layer first track group on a first conductive layer, the first layer first track group having a first plurality of conductive tracks with a first track width and defining a first pitch; and
a first layer second track group on the first conductive layer, the first layer second track group having a second plurality of conductive tracks with a second track width and defining a second pitch,
wherein the first track width is different than the second track width and the first pitch is different than the second pitch;
a second layer first track group on a second conductive layer, the second layer first track group having a first plurality of conductive tracks with the first track width and defining the first pitch; and
a second layer second track group on the second conductive layer, the second layer second track group having a second plurality of conductive tracks with the second track width and defining the second pitch.

10. The integrated circuit of claim 8, comprising:
a first layer third track group on the first conductive layer, the first layer third track group having a third plurality of conductive tracks with a third track width and defining a third pitch, wherein the third track width is different than the first track width and the second track width and the third pitch is different than the first pitch and the second pitch.

11. The integrated circuit of claim 9, comprising:
a first layer third track group on the first conductive layer, the first layer third track group having a third plurality of conductive tracks with a track spacing that is different than track spacing for the first plurality of conductive tracks and the second plurality of conductive tracks.

12. The integrated circuit of claim 9, comprising:
a second layer third track group on the second conductive layer, the second layer third track group having a third plurality of conductive tracks with a third track width and defining a third pitch, wherein the third track width is different than the first track width and the second track width and the third pitch is different than the first pitch and the second pitch.

13. The integrated circuit of claim 9, comprising:
a second layer third track group on the second conductive layer, the second layer third track group having a third plurality of conductive tracks with a track spacing that is different than track spacing for the first plurality of conductive tracks and the second plurality of conductive tracks.

14. A device, comprising:
first track groups on a first conductive layer of an integrated circuit, each of the first track groups including at least one of a different first track group pitch, a different first track group spacing, and a different first track group width than the other first track groups,
wherein each of the first track groups includes first tracks that have a different first track width than the first tracks in the other first track groups on the first conductive layer and that define a different first track pitch than the first tracks in the other first track groups on the first conductive layer; and
second track groups on a second conductive layer of an integrated circuit, each of the second track groups including at least one of a different second track group pitch, a different second track group spacing, and a different second track group width than the other second track groups,
wherein each of the second track groups includes second tracks that have at least one of a different second track width and a different second track spacing than the second tracks in the other second track groups, and
wherein each of the first track groups is configured to include first nets having an assigned first track width and each of the second track groups is configured to include second nets having an assigned second track width that is different than the assigned first track width.

15. The device of claim 14, wherein each of the first track groups includes first tracks that have a different first track width and a different first track spacing than the first tracks in the other first track groups.

16. The device of claim 14, wherein each of the second track groups includes second tracks that have a different second track width and a different second track spacing than the second tracks in the other second track groups.

17. The device of claim 14, wherein each of the second track groups includes second tracks that define a different second track pitch than the second tracks in the other second track groups.

18. The device of claim 14, wherein at least one of the first tracks is the same as one of the second tracks.

19. The device of claim 14, wherein each of the second track groups includes second tracks that have a different second track width and a different second track pitch than the second tracks in the other second track groups.

20. The device of claim 14, wherein each of the first track groups is configured to include the first nets having an assigned first track spacing and each of the second track groups is configured to include second nets having an assigned second track spacing that is different than the assigned first track spacing.

* * * * *